US 12,382,633 B2

(12) United States Patent
Speetjens et al.

(10) Patent No.: US 12,382,633 B2
(45) Date of Patent: Aug. 5, 2025

(54) MICROELECTRONIC DEVICES INCLUDING A SELECTIVELY REMOVABLE CAP DIELECTRIC MATERIAL, METHODS OF FORMING THE MICROELECTRONIC DEVICES, AND RELATED SYSTEMS

(71) Applicant: Micron Technology, Inc., Boise, ID (US)

(72) Inventors: Frank Speetjens, Boise, ID (US); Yucheng Wang, Boise, ID (US); Brendan Flynn, Boise, ID (US); S M Istiaque Hossain, Boise, ID (US); Tom J. John, Boise, ID (US); Jeremy Adams, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 403 days.

(21) Appl. No.: 17/660,767

(22) Filed: Apr. 26, 2022

(65) Prior Publication Data

US 2023/0345721 A1 Oct. 26, 2023

(51) Int. Cl.
*H10B 43/27* (2023.01)
(52) U.S. Cl.
CPC ................... *H10B 43/27* (2023.02)
(58) Field of Classification Search
None
See application file for complete search history.

(56) References Cited

U.S. PATENT DOCUMENTS

| | | | |
|---|---|---|---|
| 10,283,348 B2 | 5/2019 | Wang et al. | |
| 2016/0093635 A1* | 3/2016 | Rabkin | H01L 21/76877 |
| | | | 257/314 |
| 2017/0365487 A1 | 12/2017 | Shen et al. | |
| 2022/0254803 A1* | 8/2022 | Shen | H10B 43/10 |

OTHER PUBLICATIONS

Ovanesyan et al., "Atomic layer deposition of silicon-based dielectrics for semiconductor manufacturing: Current status and future outlook", J. Vac. Sci. Technol. A37, 060904 (2019), Sep. 24, 2019, 23 pages.
Won et al., "High-Quality Low-Temperature Silicon Oxide by Plasma-Enhanced Atomic Layer Deposition Using a Metal-Organic Silicon Precursor and Oxygen Radical", IEEE Electron Device Letters, vol. 31, No. 8, Aug. 2010, 4 pages.
Lee et al., "Investigation of Silicon Oxide Thin Films Prepared by Atomic Layer Deposition Using SiH2Cl2 and O3 as the Precursors", Japanese Journal of Applied Physics, vol. 43, No. 3A, 2004, pp. L328-L330.
Nam et al., "Low-temperature, high-growth-rate ALD of SiO2 using aminodisilane precurson", Applied Surface Science 485 (2019) pp. 381-390.
Pete Singer, "A new hardmask process, Saphira" Semiconductor Digest News and Industry Trends [online], Dec. 2014, Retrieved on Apr. 26, 2022 from the Internet: <URL: https://sst.semiconductor-digest.com/2014/12/a-new-hardmask-process-saphira/ (3 pages).

* cited by examiner

*Primary Examiner* — Asok K Sarkar
(74) *Attorney, Agent, or Firm* — TraskBritt

(57) ABSTRACT

A microelectronic device includes tiers of alternating dielectric and conductive materials, a cap oxide material vertically adjacent to the tiers, and pillars extending vertically through (Continued)

the tiers. The cap oxide material is formulated to exhibit a different etch rate relative to an etch rate of the oxide material of the tiers. Additional microelectronic devices, microelectronic systems, and methods of forming a microelectronic device are also disclosed.

20 Claims, 11 Drawing Sheets

MICROELECTRONIC DEVICES INCLUDING A SELECTIVELY REMOVABLE CAP DIELECTRIC MATERIAL, METHODS OF FORMING THE MICROELECTRONIC DEVICES, AND RELATED SYSTEMS

TECHNICAL FIELD

Embodiments disclosed herein relate to microelectronic devices and microelectronic device fabrication. More particularly, embodiments of the disclosure relate to microelectronic devices including a cap dielectric material having a different property than a dielectric material of the underlying tiers, and to related systems and methods.

BACKGROUND

Memory devices provide data storage for electronic systems. A Flash memory device is one of various memory device types and has numerous uses in modern computers and other electrical devices. A conventional Flash memory device includes a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a three-dimensional NAND (3D NAND) memory device, a type of vertical memory device, not only are the memory cells arranged in row and column fashion in a horizontal array, but tiers of the horizontal arrays are stacked (e.g., vertically stacked) over one another to provide a three-dimensional array of the memory cells. The tiers include alternating conductive materials with insulating (e.g., dielectric) materials. The conductive materials function as control gates for, e.g., access lines (e.g., word lines) of the memory cells. Vertical structures (e.g., pillars including channel materials) extend along the vertical string of the memory cells. A drain end of a string is adjacent to one of the top and bottom of the vertical structure (e.g., pillar), while a source end of the string is adjacent to the other of the top and bottom of the pillar. The drain end is operably connected to a bit line, while the source end is operably connected to a source line. 3D NAND memory devices also include electrical connections between the access lines and other conductive structures of the device so that the memory cells of the vertical strings can be selected for writing, reading, and erasing operations. String drivers drive the access line voltages to write to or read from the memory cells of the vertical string.

As memory density increases in the 3D NAND memory devices, increased aspect ratios of pillars (e.g., the length of the pillar versus the width of the pillar opening) occurs. However, as the aspect ratios of pillars increases, possibilities for pillar misalignment, cell film voids, and reduced conductive connectivity also increases.

DETAILED DESCRIPTION

Figure 1:
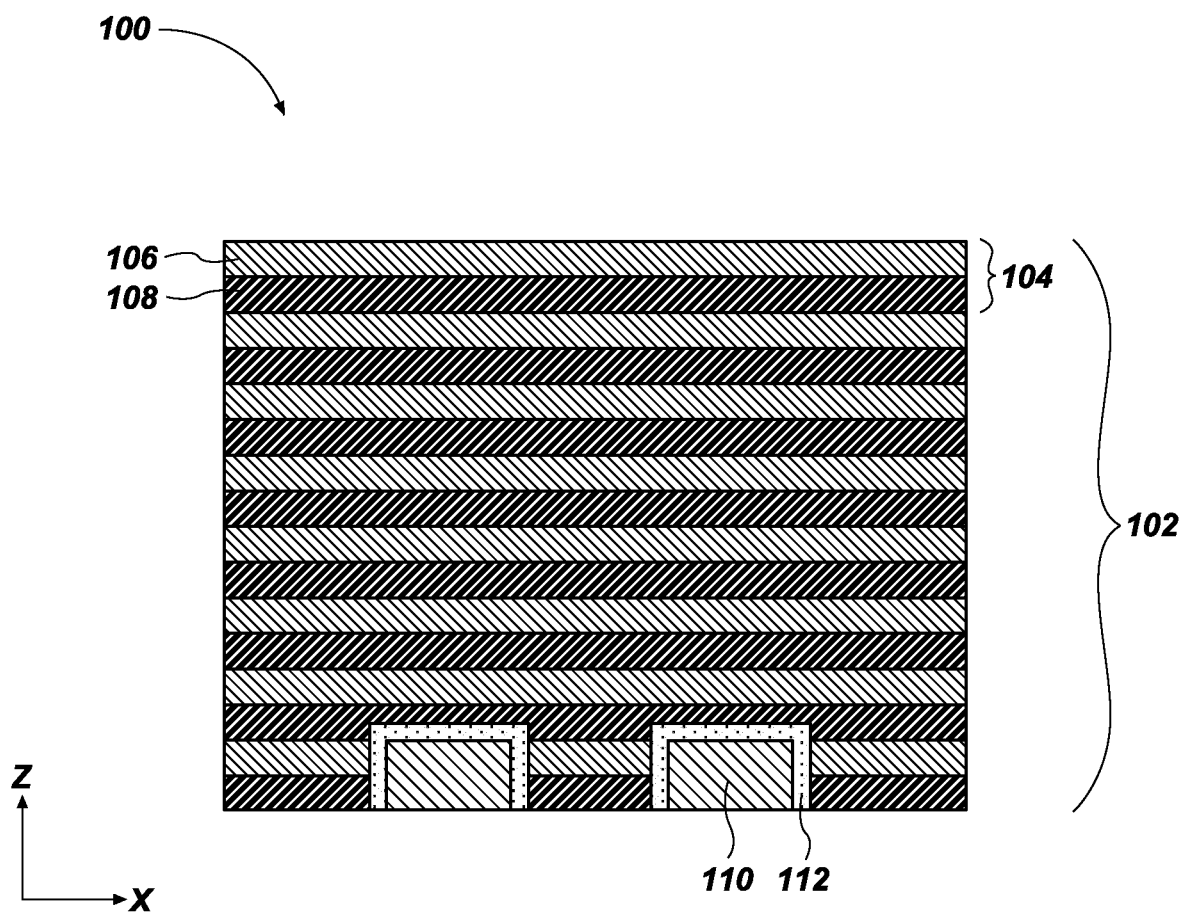
FIGS. 1 through 4D are partial cross-section views illustrating a method of forming a microelectronic device structure, in accordance with embodiments of the disclosure.
Figure 2:
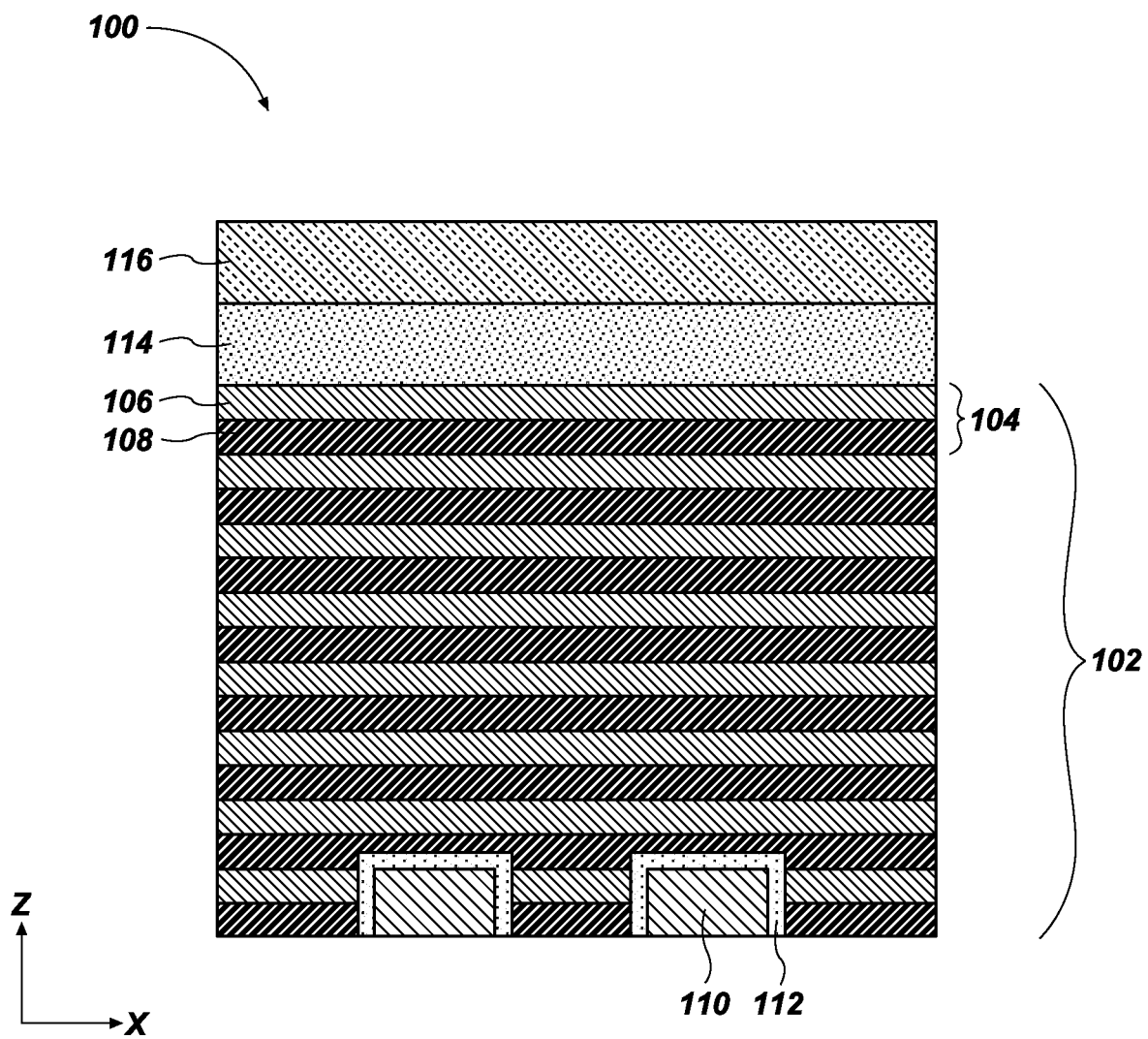

A microelectronic device (e.g., an apparatus, an electronic device, a semiconductor device, a memory device) is disclosed that includes a cap dielectric material that is formulated to be selectively removable (e.g., selectively etchable) relative to a dielectric material present in tiers of alternating dielectric materials and nitride materials used in the formation of the microelectronic device. The cap dielectric material is adjacent to an uppermost tier of the tiers of the electronic device and includes a step change at an interface between the cap dielectric material and the uppermost tier. The cap dielectric material exhibits a different quality (e.g., property) than the dielectric materials of the tiers, with the resulting quality enabling the selective removal of the cap dielectric material and corresponding formation of the step change. The cap dielectric material may, for example, exhibit a greater (e.g., faster) effective etch rate than an etch rate of the dielectric materials of the tiers when exposed to the same removal process conditions. Portions of the cap dielectric material are removed at different times (e.g., by different processes) to form pillar openings having a greater critical dimension (CD) at the top of the pillar openings and a smaller CD at the bottom of the pillar openings. The portions of the cap dielectric material are selectively removed without substantially removing the dielectric materials of the tiers. Cell films and conductive materials are subsequently formed in the pillar openings to form pillars and conductive elements. The different CDs at different locations of the pillar openings enable the cell films and conductive materials to be formed without forming voids in the resulting pillars. The different CDs also reduce misalignment between decks of the microelectronic device.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms of the terms "a," "an," and "the" are intended to include the plural forms as well, unless the context clearly indicates otherwise.

As used herein, the term "and/or" includes any and all combinations of one or more of the associated listed items.

As used herein, the terms "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "array region" means and includes a region of an electronic device including memory cells of a memory array. The array region of the electronic device includes active circuitry.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct ohmic connection or through an indirect connection (e.g., by way of another structure).

As used herein, the term "deck" means and includes multiple (e.g., two or more) tiers of alternating nitride materials and dielectric materials (e.g., relative to a microelectronic device structure) or alternating conductive materials and dielectric materials (e.g., relative to a microelectronic device).

As used herein, the term "microelectronic device" includes, without limitation, an electronic device, such as a memory device, as well as a semiconductor device which may or may not incorporate memory, such as a logic device, a processor device, or a radiofrequency (RF) device. Further, a microelectronic device may incorporate memory in addition to other functions such as, for example, a so-called "system on a chip" (SoC) including a processor and memory, or a microelectronic device including logic and memory. The microelectronic device includes tiers of alternating conductive materials and dielectric materials.

As used herein, the term "microelectronic device structure" means and includes a precursor structure to the microelectronic device, with tiers of alternating conductive materials and dielectric materials.

As used herein, the terms "horizontal" or "lateral" mean and include a direction that is parallel to a primary surface of the substrate on which the referenced material or structure is located. The width and length of a respective material or structure may be defined as dimensions in a horizontal plane. With reference to the figures, the "horizontal" or "lateral" direction may be perpendicular to an indicated "Z" axis and may be parallel to an indicated "X" axis, and the term "lateral" may be perpendicular to an indicated "Z" axis and may be parallel to an indicated "Y" axis.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "non-array region" means and includes a region of the microelectronic device proximal to the array region.

As used herein, the term "selectively removable" means and includes a material that exhibits a greater removal rate responsive to exposure to a removal chemistry and/or removal conditions, collectively referred to herein as process conditions, relative to another material exposed to the same removal chemistry and/or removal conditions. A material that is selectively removable relative to another material is substantially completely removable without removing substantially any of the another material.

As used herein, the term "selectively etchable" means and includes a material that exhibits a greater etch rate responsive to exposure to a given etch chemistry and/or etch conditions relative to another material exposed to the same etch chemistry and/or etch conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "step change" means and includes an offset between sidewalls of vertically adjacent materials. For instance, the sidewalls of one of the materials of the vertically adjacent materials are recessed (e.g., laterally recessed) relative to the sidewalls of the other material.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials are formed. The substrate may be a microelectronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the microelectronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure (e.g., parallel to the Z-axis). The major plane of the structure is defined by a surface of the structure having a relatively large area compared to other surfaces of the structure. The height of a respective material or feature (e.g., structure) may be defined as a dimension in a vertical plane.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing an apparatus (e.g., a microelectronic device, a semiconductor device, a memory device), the structures thereof, or the systems. The remainder of the process flow is known to those of ordinary skill in the art. Accordingly, only the methods and structures necessary to understand embodiments of the present apparatus and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art. Unless the context indicates otherwise, the removal of materials described herein may be accomplished by any suitable technique including, but not limited to, etching (e.g., dry etching, wet etching, vapor etching), ion milling, abrasive planarization, or other known methods.

FIGS. 1 through 4D are simplified cross-sectional views illustrating embodiments of a method of forming a microelectronic device structure (e.g., a memory device structure, such as a NAND structure) for a microelectronic device (e.g., a memory device, such as a NAND device). With the description provided below, it will be readily apparent to one of ordinary skill in the art that the methods described herein may be used to form various microelectronic devices, such as to form other microelectronic devices where 3D scaling is advantageous.

Referring to FIG. 1, a microelectronic device structure 100 may be formed to include a deck 102 having tiers 104 of alternating nitride and dielectric materials 106, 108 adjacent to (e.g., vertically adjacent to, over) a conductive material of a source (not shown) adjacent to (e.g., on) a substrate (not shown). The source is formed vertically adjacent to the substrate by conventional techniques. The alternating nitride materials 106 and dielectric materials 108 of the tiers 104 are formed adjacent to (e.g., vertically adjacent to, on) the source by conventional techniques. The nitride materials 106 may be, for example, at least one dielectric nitride material (e.g., a silicon nitride ($SiN_y$)). In some embodiments, the nitride materials 106 may be silicon nitride. The dielectric materials 108 may be an electrically insulative material. By way of non-limiting example, the dielectric materials 108 may be formed of and include one or more of at least one dielectric oxide material, and are therefore sometimes referred to as alternating oxide materials, (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). In some embodiments, the dielectric materials 108 may be formed of and may include a dielectric oxide material (e.g., $SiO_x$, such as $SiO_2$). In other embodiments, the dielectric materials 108 include silicon dioxide, and may be configured to electrically isolate conductive materials. Each of the alternating materials (e.g., nitride materials 106 and dielectric materials 108) may be substantially homogeneous in material composition, each of the alternating materials 106, 108 may be heterogeneous in material composition, or one of the alternating materials 106, 108 may be substantially homogenous in material composition, while the other is substantially heterogeneous in material composition.

Figure 4A:
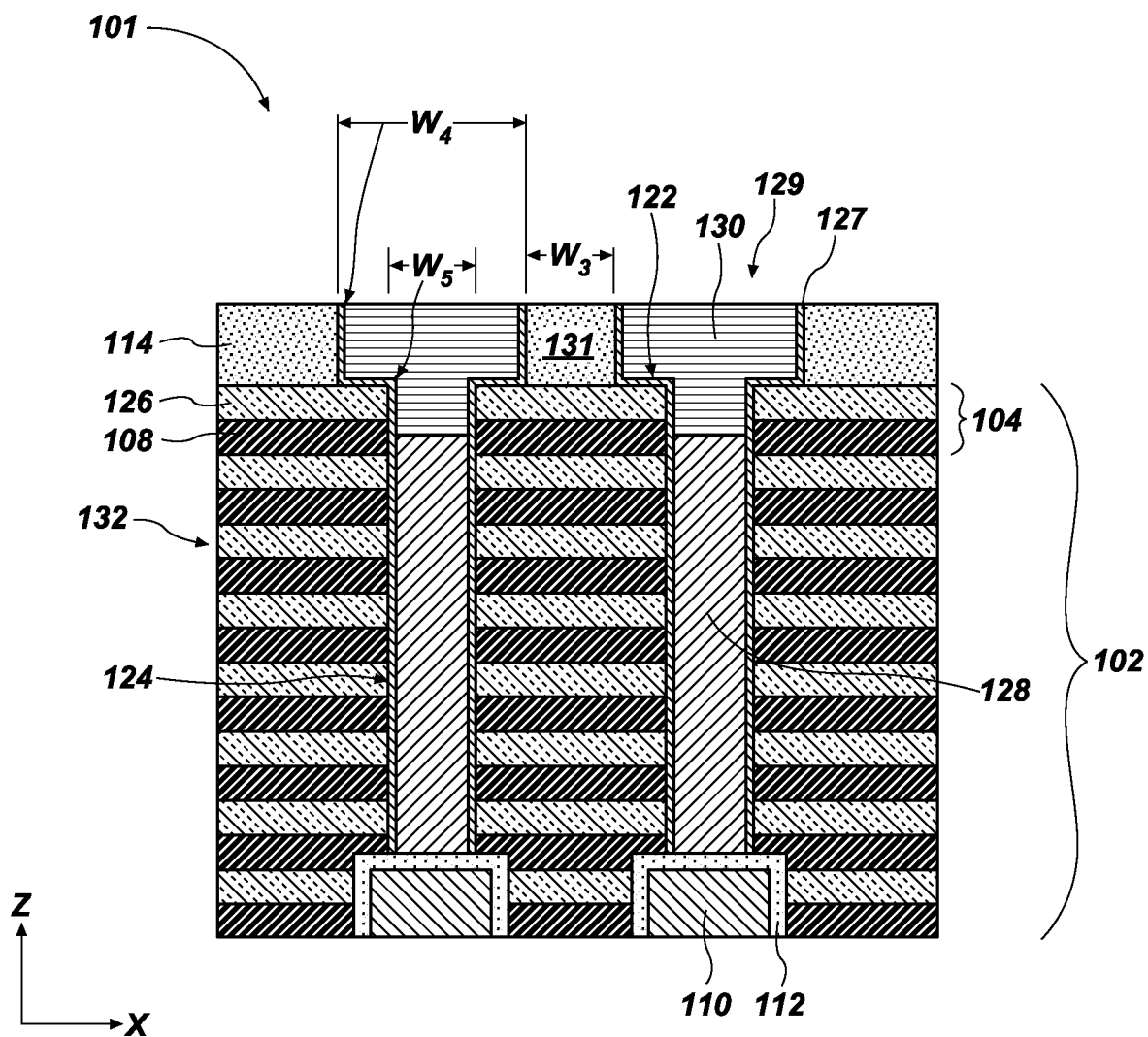

The microelectronic device structure 100 may include one or more plugs 110 that are formed of a conductive material, such as tungsten or tungsten silicide. The plugs 110 may be formed by conventional techniques. An etch stop material 112 may be adjacent to (e.g., over, surrounds, or partially surrounding) the plugs 110 and adjacent to a lower portion of the pillars (FIG. 4A, below).

The etch stop material 112 may be formed of and include at least one material this is selectively removable (e.g., selectively etchable) relative to the nitride materials 106 and the dielectric materials 108 of the tiers 104. The etch stop material 112 may be formed by conventional techniques. The materials of the tiers 104 may be selectively etchable relative to the etch stop material 112 during common (e.g., collective, mutual) exposure to first removal conditions; and the etch stop material 112 may be selectively etchable relative to the alternating materials 106, 108 during common exposure to second removal conditions. In some embodiments, the etch stop material 112 is formed of and includes a carbon nitride material ($CN_x$). The etch stop material 112 may be substantially homogeneous in material composition, or the etch stop material 112 may be substantially heterogeneous in material composition.

After forming the desired number of tiers 104, a cap dielectric material 114 is formed adjacent to an uppermost tier 104 of the deck 102. The deck 102 may, for example, include, greater than or equal to 10 tiers, greater than or equal to 20 tiers, greater than or equal to 40 tiers, greater than or equal to 80 tiers, greater than or equal to 160 tiers, etc. A material of the cap dielectric material 114 is selected to be selectively removable relative to the nitride materials 106 and the dielectric materials 108 of the tiers 104. The cap dielectric material 114 is also selectively removable relative to the etch stop material 112. In some embodiments, the selective removal of the cap dielectric material 114 is achieved without including dopants or other impurities in the cap dielectric material 114 or in the dielectric materials 108. Instead, the selective removal of the cap dielectric material 114 is achieved by appropriately selecting the materials of the cap dielectric material 114 and the dielectric materials 108 and/or the deposition techniques for forming the cap dielectric material 114 and the dielectric materials 108. In other embodiments, the selective removal of the cap dielectric material 114 is achieved by including dopants in one or more of the cap dielectric material 114 or the dielectric materials 108. For instance, the cap dielectric material 114 and the dielectric materials 108 may be formed of different materials (e.g., different material compositions) having sufficiently different etch rates. Alternatively, the cap dielectric material 114 and the dielectric materials 108 may be formed of similar materials (e.g., similar material compositions) by different techniques that result in the materials having sufficiently different etch rates to provide the etch selectivity.

By way of non-limiting example, the cap dielectric material 114 may be formed of and include at least one of a silicon oxide, a silicon oxycarbide, and a silicon oxynitride. For convenience, the cap dielectric material 114 may also be referred to herein as cap oxide material 114. The cap dielectric material 114 may be doped or undoped to achieve the desired etch selectivity relative to the dielectric materials 108. In some embodiments, the cap dielectric material 114 is formed of and includes silicon dioxide. The cap dielectric material 114 may be homogeneous in material composition or may be heterogeneous in material composition. The cap dielectric material 114 may be selectively removable relative to the dielectric materials 108 of the tiers 104 using the same removal conditions, such as the same etch chemistry and/or process conditions. For instance, the etch rate of the cap dielectric material 114 may be faster than the etch rate of the dielectric materials 108 when the cap dielectric material 114 and the dielectric materials 108 are exposed to a wet etch process.

The selective removal may be achieved even if the cap dielectric material 114 and the dielectric materials 108 exhibit substantially similar material compositions. For instance, by forming the cap dielectric material 114 and the dielectric materials 108 using different processes, such as different deposition processes, the cap dielectric material 114 may be selectively removable relative to the dielectric materials 108. The cap dielectric material 114 may, for example, be a silicon oxide material that is deposited by one or more of CVD, PVD, ALD, or spin-coating over upper surfaces of the tiers 104 while the dielectric materials 108 are formed by a different one of CVD, PVD, ALD, or spin-coating. Alternatively, the same deposition process may be used to form the cap dielectric material 114 and the dielectric materials 108, except one or more process parameter (e.g., temperature, precursor, other reaction conditions) is different to achieve the desired etch selectivity. By way of example only, the dielectric materials 108 may be formed by a CVD process and the cap dielectric material 114 may be formed by an ALD process, or the dielectric materials 108 may be formed by an ALD process conducted at a first temperature and/or a first pressure and the cap dielectric material 114 may be formed by an ALD process conducted at a different, second temperature and/or a second pressure. Alternatively, the dielectric materials 108 may be formed by an ALD process using a first ALD precursor and the cap dielectric material 114 may be formed by an ALD process using a second, different ALD precursor. In other words, the first ALD process differs from the second ALD process by at least one precursor.

Dielectric material 108 precursors may include, but are not limited to, silane precursors (e.g., silane ($SiH_4$), disilane ($Si_2H_6$), dichlorosilane ($SiH_2Cl_2$) (DCS), trimethylsilane (($CH_3$)$_3$SiH), tetramethylsilane (($CH_3$)$_4$Si), hexachlorodisilane (($SiCl_3$)$_2$) (HCDS), tris(dimethylamino)silane, tetraisocyannate ($Si(NCO)_4$) silane, etc.), oxygen precursors (e.g., $O_3$, $O_2$, $H_2O$, etc.), alkoxide precursors (e.g., tetraethoxysilane), metal-organic precursors and/or amino precursors (e.g., $SiH_2[N(C_2H_5)_2]_2$[bis-diethylamino-silane](BDEAS)), diisopropylaminosilane (DIPAS), Lewis base catalysts (e.g., pyridine, ammonia, etc.), $N_2$, $NH_x$, and combinations thereof. Cap dielectric material 114 precursors may include, but are not limited to, silane precursors (e.g., silane ($SiH_4$), disilane ($Si_2H_6$), dichlorosilane ($SiH_2Cl_2$) (DCS), trimethylsilane (($CH_3$)$_3$SiH), tetramethylsilane (($CH_3$)$_4$Si), hexachlorodisilane (($SiCl_3$)$_2$) (HCDS), tris(dimethylamino)silane, tetraisocyannate ($Si(NCO)_4$) silane, etc.), trisilylamine precursors, oxygen precursors (e.g., $O_3$, $O_2$, $H_2O$, etc.), alkoxide precursors (e.g., tetraethoxysilane), metal-organic precursors and/or amino precursors (e.g., $SiH_2[N(C_2H_5)_2]_2$ [bis-diethylamino-silane](BDEAS)), a precursor with an Si—Si bond (e.g., 1,2-bis(diisopropylamino)disilane (BDIPADS)) (e.g., having a density of about 0.84 g/ml), diisopropylaminosilane (DIPAS), $(BuO)_3SiOH$ and $(CH_3)_3Al$, Lewis base catalysts (e.g., pyridine, ammonia, etc.), $N_2$, $NH_x$, halidosiloxane, octachlorotrisiloxane (OCTSO), and combinations thereof. In other words, in some embodiments, the cap dielectric material 114 may be a different dielectric (e.g., oxide) material than the dielectric (e.g., oxide) of the dielectric material 108.

The desired etch selectivity between the cap dielectric material 114 and the dielectric materials 108 may also be achieved by using a different deposition tool to form the cap dielectric material 114 than is used to form the dielectric materials 108. For example, a first tool may be used to conduct a first in situ ALD process to form the cap dielectric material 114 or the dielectric materials 108, and a second tool may be used to conduct a second ex situ ALD process to form the other of the cap dielectric material 114 or the dielectric materials 108, where the second ALD process differs from the first by one or more parameters (e.g., temperature, precursor, other reaction conditions). However, the first and second tools are not limited to ALD tools. Rather, the first tool may include a CVD tool capable of depositing the dielectric materials 108 of the tiers 104, while the second tool may be the same tool and is capable of forming the cap dielectric material 114 by a process having one or more different parameter (e.g., temperature, precursor, other reaction conditions) than the first tool. For example, a parameter (e.g., pressure) of the CVD tool may be altered after forming the alternating tiers 104 of nitride and dielectric materials 106, 108 to form the cap dielectric material 114. In some embodiments, a physical vapor deposition (PVD) process is used in forming the tiers 104 of alternating materials 106, 108, and a growth mechanism (e.g., ion bombardment, temperature, etc.) of the PVD process is altered before forming, and in order to form, the cap dielectric material 114. Without being bound by any theory, it is believed that the different processes or the process conditions used to form the cap dielectric material 114 and the dielectric materials 108 alter the bonding characteristics (e.g., increase bond angle) of the resulting materials. For instance, different bonding characteristics may occur between silicon atoms and oxygen atoms of the materials, or between silicon atoms and hydroxide groups of the materials. The different bonding characteristics may cause the cap dielectric material 114 to exhibit a lower density than the dielectric materials 108, enabling the cap dielectric material 114 to be selectively etchable. Deposition temperatures for forming the dielectric materials 108, may range from about 20° C. to 1000° C., while deposition temperatures for forming the cap dielectric material 114 may be lower (e.g., ranging from about 20° C. to about 700° C.). In some embodiments, deposition temperatures for forming the dielectric materials 108, may range from about 500° C. to 800° C., while deposition temperatures for forming the cap dielectric material 114 may range from about 250° C. to 650° C. In other embodiments, the deposition temperature for the cap dielectric material 114 is less than 100° C.

Pressures for forming the dielectric material 108 may range from about 0.1 torr to about 5 torr. In some embodiments, pressures for forming the dielectric material 108 may range from about 0.1 torr to about 3 torr. In other embodiments, pressures for forming the dielectric material 108 may range from about 0.5 torr to about 2 torr. Pressures for forming the cap dielectric material 114 may range from about 0.01 torr to about 5 torr. In some embodiments, pressures for forming the cap dielectric material 114 may range from about 0.01 torr to about 2 torr. In other embodiments, pressures for forming the cap dielectric material 114 may range from about 0.01 torr to about 0.5 torr.

The density of the cap dielectric material 114 may be less than a density of the dielectric material 108. For example, an oxide density of the cap dielectric material 114 may range from about 2.0 g/cm$^3$ to about 2.5 g/cm$^3$. In some embodiments, the oxide density of the cap dielectric material 114 may range from about 2.05 g/cm$^3$ to about 2.2 g/cm$^3$. The density of the dielectric materials 108 may range from about 2.2 g/cm$^3$ to about 2.7 g/cm$^3$.

A hard mask material 116 may be formed adjacent the cap dielectric material 114 by conventional techniques. The hard mask material 116 may be a doped hard mask material (e.g., a boron-doped hard mask material), a carbon hard mask material, or other hard mask material. In some embodiments, the hard mask material 116 is formed of and includes one or more of amorphous carbon and doped amorphous carbon (e.g., boron-doped amorphous carbon, such as boron-doped amorphous carbon comprising at least 1 weight percent (wt %) boron and at least 20 wt % carbon, such as between about 1 wt % boron and about 40 wt % boron, and between about 99 wt % carbon and about 60 wt % carbon). In other embodiments, the hard mask material 116 is a boron-doped hard mask material. In additional embodiments, the hard mask material 116 is a carbon hard mask material.

Figure 3:
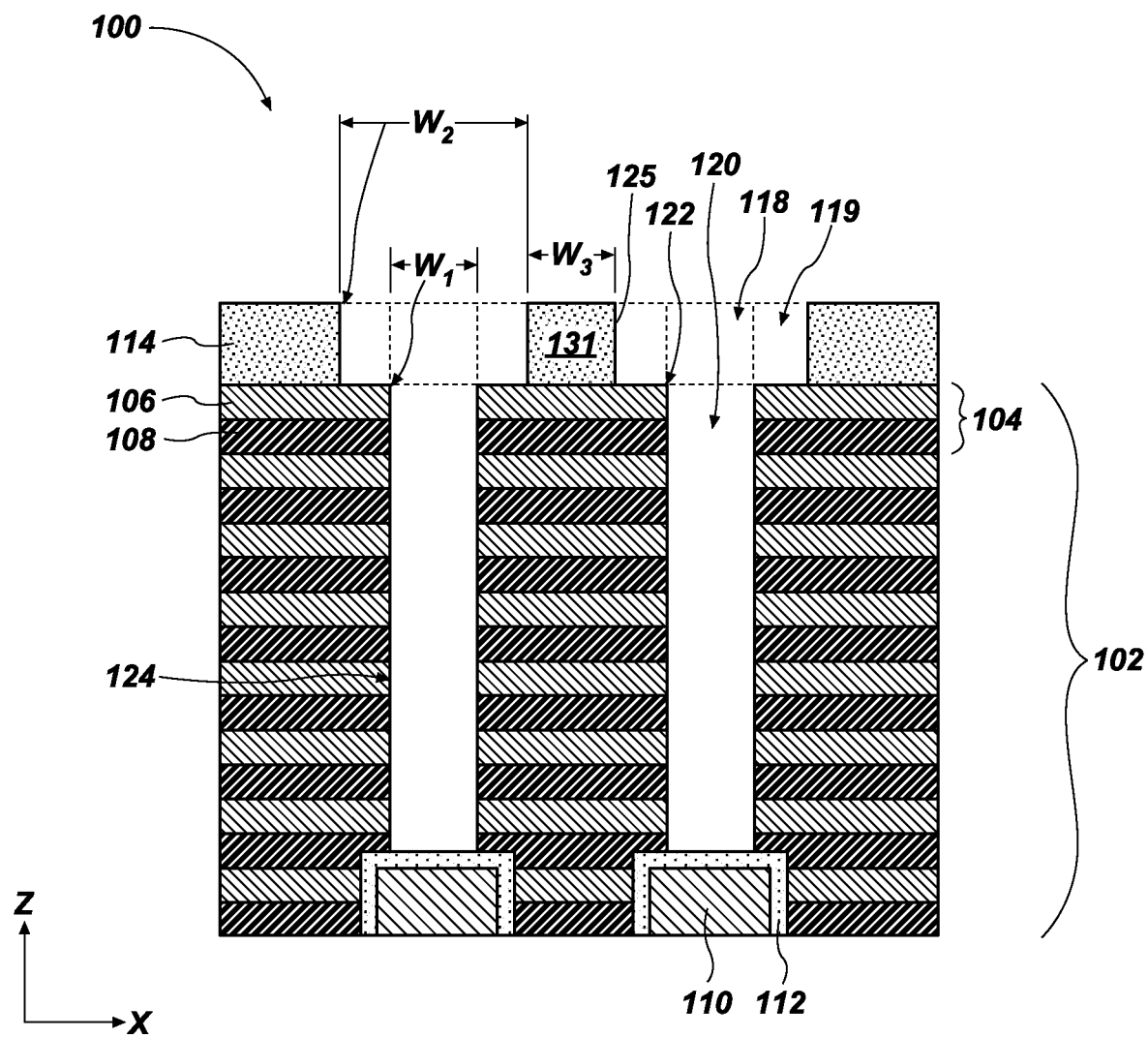

Referring to FIG. 3, the hard mask material 116 may be patterned by conventional photolithography and etching techniques and the pattern transferred to the cap dielectric material 114 to expose the tiers 104. The pattern may include linear and/or non-linear features and linear and/or non-linear openings. In some embodiments, an anisotropic etch process is performed to pattern the cap dielectric material 114 using the patterned hard mask material 116 as a mask. In other embodiments, an isotropic etch process is used to pattern the cap dielectric material 114 using the patterned hard mask material 116 as a mask. In some embodiments, first an anisotropic etch is used, followed by a subsequent isotropic etch. The removal conditions may be selected based on the materials used as the hard mask material 116 and the cap dielectric material 114.

First portions 118 of the cap dielectric material 114 are removed to form openings adjacent to (e.g., vertically adjacent to, over) the plugs 110 and etch stop material 112 and to expose the tiers 104. A width (e.g., $W_1$) of the openings in the patterned hard mask material and the patterned cap dielectric material 114 corresponds to a critical dimension (CD) (e.g., $W_5$) of pillars (see FIG. 4A) subsequently formed. The first portions 118 of the cap dielectric material 114 may be removed by a dry etch process or a wet etch process. The removal conditions used to remove the first portions 118 may be selected based on the materials used as the hard mask material 116 and the cap dielectric material 114. In some embodiments, a thickness of the first portions 118 removed is less than a thickness of the cap dielectric material 114. In other embodiments, a thickness of the first portions 118 removed is substantially equal to the thickness of the cap dielectric material 114.

After patterning the cap dielectric material 114, the hard mask material 116 is removed. Sidewalls of the patterned cap dielectric material 114 and an uppermost tier 104 of the alternating materials 106, 108 define the openings over the plugs 110 and etch stop material 112.

After exposing the uppermost tier 104, underlying portions of the alternating nitride materials 106 and dielectric materials 108 of the deck 102 may be removed to form pillar openings 120, into which channel material and cell film materials of the pillars (e.g., memory pillars) (FIGS. 4A-4D) are subsequently formed. The pillar openings 120 extend through the tiers 104 and expose the etch stop material 112. The pillar openings 120 may be formed by removing materials of the tiers 104 by conventional etch techniques, such as by a wet etch process or a dry etch process. The removal conditions may be selected based on the materials used as the tiers 104. The pillar openings 120 proximal to the plugs 110 and distal to the plugs 110 exhibit substantially the same CD as the openings in the patterned hard mask material 116 and the patterned cap dielectric material 114. Substantially no removal of the underlying materials of the plugs 110, source, and substrate occurs during the formation of the pillar openings 120.

In some embodiments, a wet etch process is used to form the pillar openings 120. The etchant may comprise one or more of hydrofluoric acid (HF), a buffered oxide etchant (BOE), and nitric acid ($HNO_3$). In some embodiments, the etchant comprises a solution including water and HF at a ratio within a range of from about 500:1 to about 100:1.

The removal of the cap dielectric material 114 and the tiers 104 may be conducted by separate process acts, as described above, and performed with different tools, or at least at different times and using different parameters (e.g., pressure and/or temperature). Alternatively, the removal of the tiers 104 to form the pillar openings 120 and the removal of the portions of the cap dielectric material 114 may be conducted substantially simultaneously (e.g., occur within a single process act).

As shown in FIG. 3, the pillar openings 120 may be high aspect ratio (HAR) openings defined by sidewalls 124 of the tiers 104 and sidewalls 125 of the cap dielectric material 114. The pillar openings 120 are further defined by upper surfaces of the etch stop material 112.

In some embodiments, the sidewalls 125 of the cap dielectric material 114 are substantially tapered (e.g., sloped) relative to the substantially vertical sidewalls 124 of the pillar openings 120, similar to plug sidewalls of FIG. 4B, below. In other embodiments, the sidewalls 125 of the cap dielectric material 114 are bowed (e.g., concave) relative to the sidewalls 124 of the pillar openings 120, similar to plug sidewalls of FIG. 4C. In additional embodiments, sidewalls 125 of the cap dielectric material 114 are curved (i.e., non-linear) relative to the sidewalls 124 of the pillar openings 120, similar to plug sidewalls of FIG. 4D.

The width $W_3$ of an upper surface of a portion 131 of the cap dielectric material 114 is from about 20 to about 40 nanometers between horizontal boundaries. In some embodiments, the upper surface of the portion 131 may range from about 20 nanometers to about 30 nanometers in width (e.g., $W_3$). In other embodiments the upper surface of portion 131 is from about 20.0 to about 21.5 nanometers in width. In some embodiments, the upper surface of portion 131 is substantially equal in dimension to the lower surface of the portion 131 of the cap dielectric material 114. In other embodiments (FIGS. 4B to 4D), the width of the upper surface is not equal in dimension to a lower surface of the portion 131.

After removing the first portions 118 of the cap dielectric material 114, the sidewalls 125 of the cap dielectric material 114 and the tiers 104 may be substantially vertical, as indicated in FIG. 3 by dashed lines and in FIG. 4A. Alternatively, the sidewalls of the cap dielectric material 114 and the tiers 104 may be sloped (see FIGS. 4B, 4C). The width $W_1$ of the pillar openings 120 may be substantially the same proximal to the plugs 110 and distal to the plugs 110. In other words, the width $W_1$ of the pillar openings 120 laterally adjacent to the cap dielectric material 114 and the width $W_1$ of the pillar openings 120 laterally adjacent to the tiers 104 may be substantially the same as one another.

The width $W_1$ of the pillar openings 120 laterally adjacent to the cap dielectric material 114 may be adjusted (e.g., increased) by conducting an additional removal act. The width of the pillar openings 120 may be increased to width $W_2$ by selectively removing second portions 119 of the cap dielectric material 114 without substantially removing the dielectric materials of the tiers 104. The additional removal act may more precisely remove portions of the cap dielectric material 114 than were removed in the initial removal act. Removing the second portions 119 results in the formation of a step change 122 between the sidewalls 124 of the tiers and the sidewalls 125 of the cap dielectric material 114. Following the additional removal act, the width (e.g., $W_2$) of the pillar openings 120 laterally adjacent to the cap dielectric material 114 may be greater than the initial width (e.g., $W_1$) of the pillar openings 120. The removal conditions for increasing the width of the pillar openings 120 may be selected based on the materials used as the nitride materials 106, the dielectric materials 108, and the cap dielectric material 114, and/or the deposition process to form the dielectric materials 108 and the cap dielectric material 114. In some embodiments, the first portions 118 of the cap dielectric material 114 are removed by a dry etch process and the second portions 119 are selectively removed by a wet etch process.

The second portions 119 of the cap dielectric material 114 may be removed in a lateral direction. Removing the second portions 119 results in an increase in width of the pillar openings 120 laterally adjacent to the cap dielectric material 114 of from about 30% to about 40% compared to the width of the pillar openings 120 proximal to the plugs 110. After removal of the second portions 119, the sidewalls 124 of the tiers and the sidewalls 125 of the cap dielectric material 114 are no longer aligned relative to the step change 122. The step change 122 may form a transitional interface between the lesser width of the pillars 129 and a greater width of the plugs 130. A size of the step change 122 (e.g., amount of offset between sidewalls 124 and sidewalls 125) may vary depending on a number of formation parameters, including but not limited to, a width, $W_3$, of the cap dielectric material 114 between pillar openings 120, a material composition of the cap dielectric material 114, the sidewalls 125 being sloped or vertical, and/or a pitch of pillars formed in the pillar openings 120. The step change 122 may form a substantially right angle (see FIG. 4A) if the sidewalls 125 are vertically offset from the sidewalls 124, one or more angles less than about 90° if the sidewalls 125 are sloped (see FIG. 4B, FIG. 4C), or curved surfaces if the sidewalls 125 are curved (i.e., non-linear) (see FIG. 4D).

In some embodiments, after a second etch process, sidewalls 125 of the cap dielectric material 114 are offset (e.g., laterally offset, laterally recessed) from the sidewalls of the tiers 104 by an amount of offset (e.g., recess) that is dependent on an amount of time a wet etch process is conducted. Depending on the time and the process conditions used, the sidewalls of the cap dielectric material 114 may be curved (see FIG. 4D), sloped (see FIG. 4B, FIG. 4C), or may be substantially vertical (see FIG. 4A).

By removing the first portions 118 and the second portions 119 of the cap dielectric material 114 in separate process acts, the CD of the pillar openings 120 proximal to the plugs 110 (see FIG. 4A) may be maintained while widening the pillar openings 120 proximal to the plugs 130. Therefore, after the second removal act, the widths of the pillar openings 120 proximal to the plugs 110 and distal to the plugs 110 may be different. By forming the pillar openings 120 having two or more different widths along a height thereof, the pillar openings 120 have a greater width at the top of the pillar openings 120 and a smaller width at the bottom of the pillar openings 120, with the greater width laterally adjacent to the cap dielectric material 114 and the smaller width laterally adjacent to the tiers 104. The width of the pillar openings 120 laterally adjacent to the tiers 104 corresponds to the CD of the pillar openings 120, while the width of the pillar openings 120 laterally adjacent to the cap dielectric material 114 is greater. The different widths at different locations within the pillar openings 120 enable the cell films and conductive materials to be formed without forming voids in the resulting pillars.

In other words, the increased width of the pillar openings 120 laterally adjacent to the cap dielectric material 114 increases the process margin for subsequently conducted process acts. In conventional processes where a cap dielectric material is formed of the same dielectric material as the dielectric materials of the tiers, no step change would be present at the interface because the materials would be etched at substantially the same rates.

Referring to FIG. 4A, nitride materials 106 of the tiers 104 are removed to form openings (not shown) between the dielectric materials 108 of the tiers 104. Conductive materials 126 are formed in the openings between the dielectric materials 108 of the tiers 104. The nitride materials 106 are, therefore, removed and replaced with the conductive materials 126 through a slit (not shown) as part of a so-called "replacement gate" or "gate last" process. The nitride materials 106 of the tiers may be removed by exposing the nitride materials to a wet etchant comprising one or more of phosphoric acid, sulfuric acid, hydrochloric acid, nitric acid, or another etch chemistry, such as a so-called "wet nitride strip" comprising a wet etchant comprising phosphoric acid.

After removal of the nitride materials 106, conductive materials 126 may be formed between the neighboring dielectric materials 108 at locations corresponding to the previous locations of the nitride materials 106 to form a microelectronic device structure 101 comprising tiers of alternating levels of dielectric materials 108 and conductive materials 126 (e.g., FIGS. 4A to 4D). The conductive materials 126 may function as access lines (e.g., word lines). One or more lower conductive materials 126 of the microelectronic device structure 101 may function as one or more lower select gate (e.g., at least one source side select gate (SGS)) and one or more upper conductive materials 126 may function as at least one upper select gate (e.g., at least one drain side select gate (SGD)) of the microelectronic device structure 101.

The conductive materials 126 may each individually be formed of and include an electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive materials 126 comprise tungsten.

The conductive materials 126 may include a conductive liner material (not shown) around the conductive materials 126, such as between the conductive materials 126 and the dielectric materials 108. The conductive liner material may comprise, for example, a seed material from which the conductive materials are formed. The conductive liner material may be formed of and include, for example, a metal (e.g., titanium, tantalum), a metal nitride (e.g., tungsten nitride, titanium nitride, tantalum nitride), or another material. In some embodiments, the conductive liner material comprises titanium nitride.

Channel and cell materials 127 are conformally formed on the sidewalls 124 of the tiers 104 and partially fill the pillar openings 120. Although multiple materials are present, the channel material and cell materials 127 are shown as a single material in FIGS. 4A-4D for convenience. The channel material may be polysilicon or other channel material as known in the art. The cell materials may be one or more of a dielectric material, a conductive material, etc. The cell material(s) may include one or more of an oxide material, a storage material, or a tunnel dielectric material as known in the art. By way of example only, the cell materials may include an oxide-nitride-oxide (ONO) structure having a dielectric material (e.g., a tunnel dielectric material), a charge trapping material, and a charge blocking material between the channel material and the dielectric materials or the conductive materials (described in greater detail below). The charge trapping material may be located directly between the dielectric material and the charge blocking material. In some embodiments, the dielectric material directly contacts the channel material and the charge trapping material. The charge blocking material may directly contact and may be located directly adjacent to the charge trapping material and the dielectric materials or the conductive materials.

Fill material 128 is formed in remaining portions of the pillar openings 120 to form pillars 129 (e.g., memory pillars) of the microelectronic device structure 101. The fill material 128 may be a dielectric material, such as a silicon oxide material (e.g., silicon dioxide, phosphosilicate glass, borosilicate glass, borophosphosilicate glass, fluorosilicate glass, or a combination thereof), a metal oxide material (e.g., titanium dioxide, hafnium oxide, zirconium dioxide, tantalum oxide, magnesium oxide, hafnium magnesium oxide, aluminum oxide, or a combination thereof), or a combination thereof. In some embodiments, the fill material 128 may substantially and/or completely fill the pillar openings 120 in which the pillars are formed. In some embodiments, a portion of the fill material 128 is removed, such as by an etch process, forming recesses into which adjacent plugs 130 are formed. In other embodiments, the fill material 128 only partially fills the pillar openings 120, and the conductive material for the plugs 130 is formed vertically adjacent to the fill material 128 in the remaining portions of the pillar openings 120 to form the pillars 129.

The plugs 130 have one or more widths depending on how the sidewalls 125 of the cap dielectric material 114 are formed. For example, an upper width, $W_4$, of the plugs 130 may be greater than a lower width, $W_5$.

The lower width, $W_5$, of the plugs 130 may be dependent on the pattern of the hard mask material 116 used to form the pillar openings 120. The lower width, $W_5$, of the plugs 130 may correspond to a width, or a critical dimension, of the pillar openings 120. At least the upper width, $W_4$, is increased by about 20% to 40% relative to the lower width, $W_5$, of the plugs 130. In some embodiments, at least the upper width, $W_4$, is increased by about 20% to 30% relative to the lower width, $W_5$, of the plugs 130.

In some embodiments, the plugs 130 represent multiple additional conductive plugs that are not shown, and at least one of the total number of conductive plugs of the plugs 130 exhibits an increased horizontal dimension (e.g., width) relative to a horizontal dimension (e.g., width) of at least one pillar 129. In other embodiments, the plugs 130 represent multiple conductive plugs that are not shown, and all of the conductive plugs of the plugs 130 exhibit an increased horizontal dimension (e.g., width) relative to respective horizontal dimensions (e.g., width) of each of the pillars 129.

In some embodiments, the plugs 130 are formed of multiple, different conductive materials (e.g., metal alloys), and are substantially homogeneous in material composition (e.g., metal used to form alloys are uniformly distributed throughout the plug structure). In other embodiments, the plugs 130 are formed of multiple, different conductive materials, and are substantially heterogeneous in material composition (e.g., layered, doped, etc.). In additional embodiments, the plugs 130 are formed substantially of a single conductive material, and substantially homogenous in material composition.

Formation of the conductive materials 126 and pillars 129 may form strings of memory cells 132. The memory cells 132 of the strings may be located at intersections of the channel and cell materials 127 and the conductive materials 126, and may individually include a portion of one of the pillars 129 and a portion of one of the conductive material 126. Vertically neighboring memory cells 132 of the strings may be separated from each other by one of the levels of the dielectric materials 108.

In some embodiments, the cap dielectric material 114 electrically isolates conductive materials from one another (e.g., plugs 130 from other plugs and/or other conductive structures overlying the deck 102). The cap dielectric material 114 may also electrically isolate another microelectronic device structure (e.g., CMOS control circuitry) from the conductive materials of the microelectronic device structure 101. In some embodiments, the cap dielectric material 114 may be formed over each of an array region, a non-array region, and a periphery region. In other embodiments, the cap dielectric 114 may be confined to one or two or more of the regions of the microelectronic device structure 101.

In some embodiments, the selective removal of the cap dielectric material 114 is achieved without including dopants in the cap dielectric material 114, such as by forming the cap dielectric material 114 and the dielectric materials 108 of the tiers 104 by different processes. Therefore, the microelectronic device structure is formed without affecting electrical performance of the resulting microelectronic device or downstream process acts.

Figure 4B:
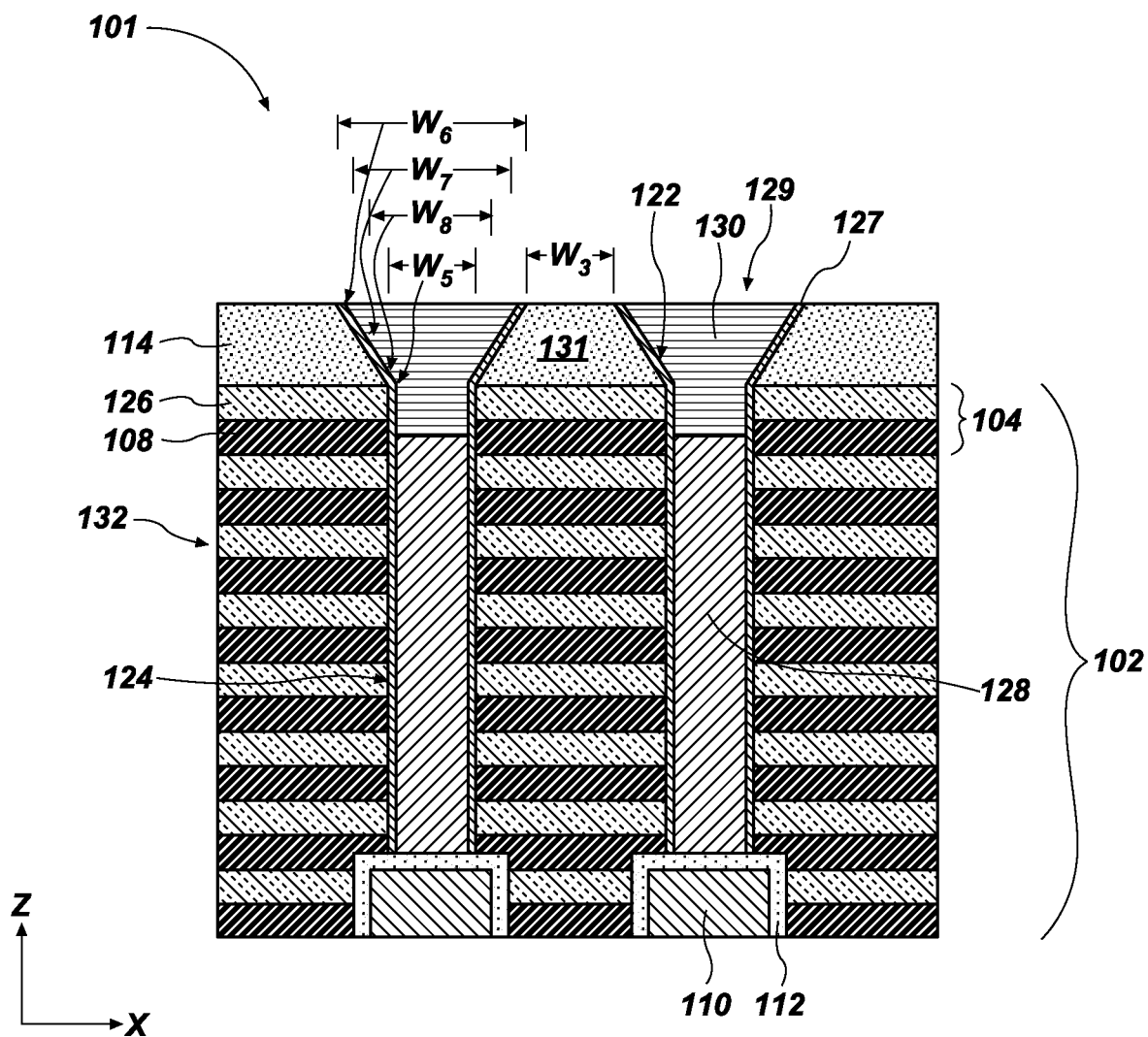

Referring to FIG. 4B, a microelectronic device structure 101 is depicted having plugs 130 with tapered sidewalls. The tapered sidewalls of the plugs 130 correspond to tapered sidewalls of the cap dielectric material 114 formed according to a selective removal of second portions 119 in the formation of another embodiment of microelectronic device structure 101. The tapered sidewalls result in an upper width $W_6$ of the plugs 130 that is greater than a middle width $W_7$, where the middle width $W_7$ is greater than a lower width $W_8$.

An upper surface of the portion 131 of the cap dielectric material 114 may range from about 15 to about 30 nanometers between horizontal boundaries; whereas, a lower surface of the portion 131 may range from about 20 to about 40 nanometers. In some embodiments, a horizontal dimension of the upper surface of the portion 131 is about 20.0, 20.5, 21.0, 21.5, 22.0, 22.5 and 23.0 nanometers; while a horizontal dimension of the lower surface of the portion 131 is about 32.0, 32.5, 33.0, 33.5, 34.0, and 34.5 nanometers. In some embodiments, a horizontal dimension of the upper surface of portion 131 is less than a horizontal dimension of the lower surface of the portion 131 of the cap dielectric material 114.

Figure 4C:
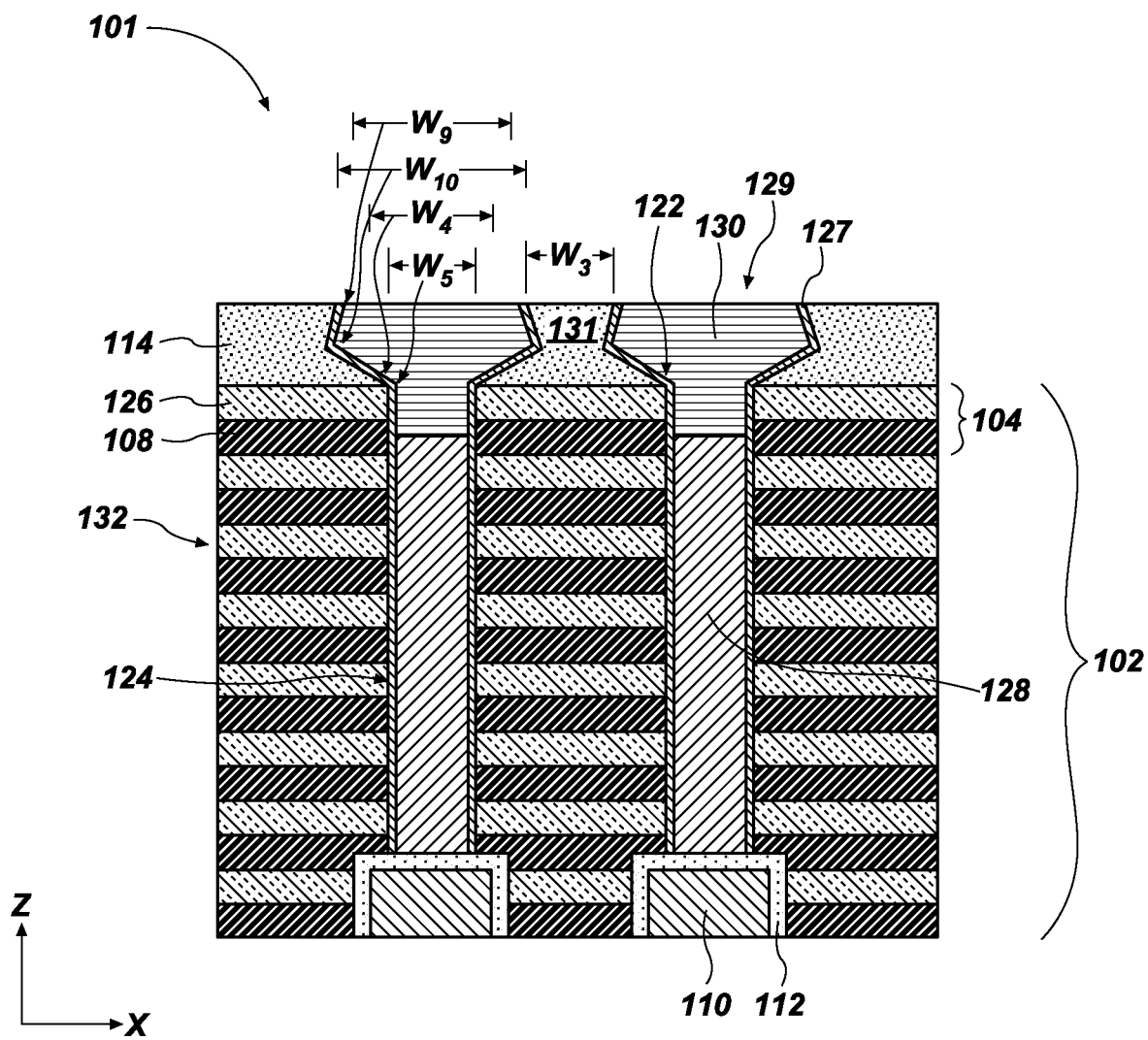

Referring to FIG. 4C, a microelectronic device structure 101 is depicted having plugs 130 with linearly bowed sidewalls. The linear, bowed sidewalls of the plugs 130 correspond to linear, bowed sidewalls of the cap dielectric material 114 formed according to a selective removal of second portions 119 in the formation of another embodiment of microelectronic device structure 101. The linearly bowed sidewalls result in an upper width $W_9$ of the plugs 130 that is less than a middle width $W_{10}$, where the middle width $W_{10}$ is greater than a lower width $W_{11}$.

An upper surface of the portion 131 of the cap dielectric material 114 may range from about 15 to about 30 nanometers between horizontal boundaries; whereas, a mid-section of the portion 131 may range from about 10 to about 20 nanometers in horizontal width, while a lower surface of the portion 131 may range from about 20 to about 40 nanometers. In other words, a horizontal dimension of the upper surface of portion 131 is greater than a horizontal dimension of the mid-section of the portion 131; whereas, a horizontal dimension of the mid-section of the portion 131 is less than a horizontal dimension of the lower surface of the portion 131 of the cap dielectric material 114.

Figure 4D:
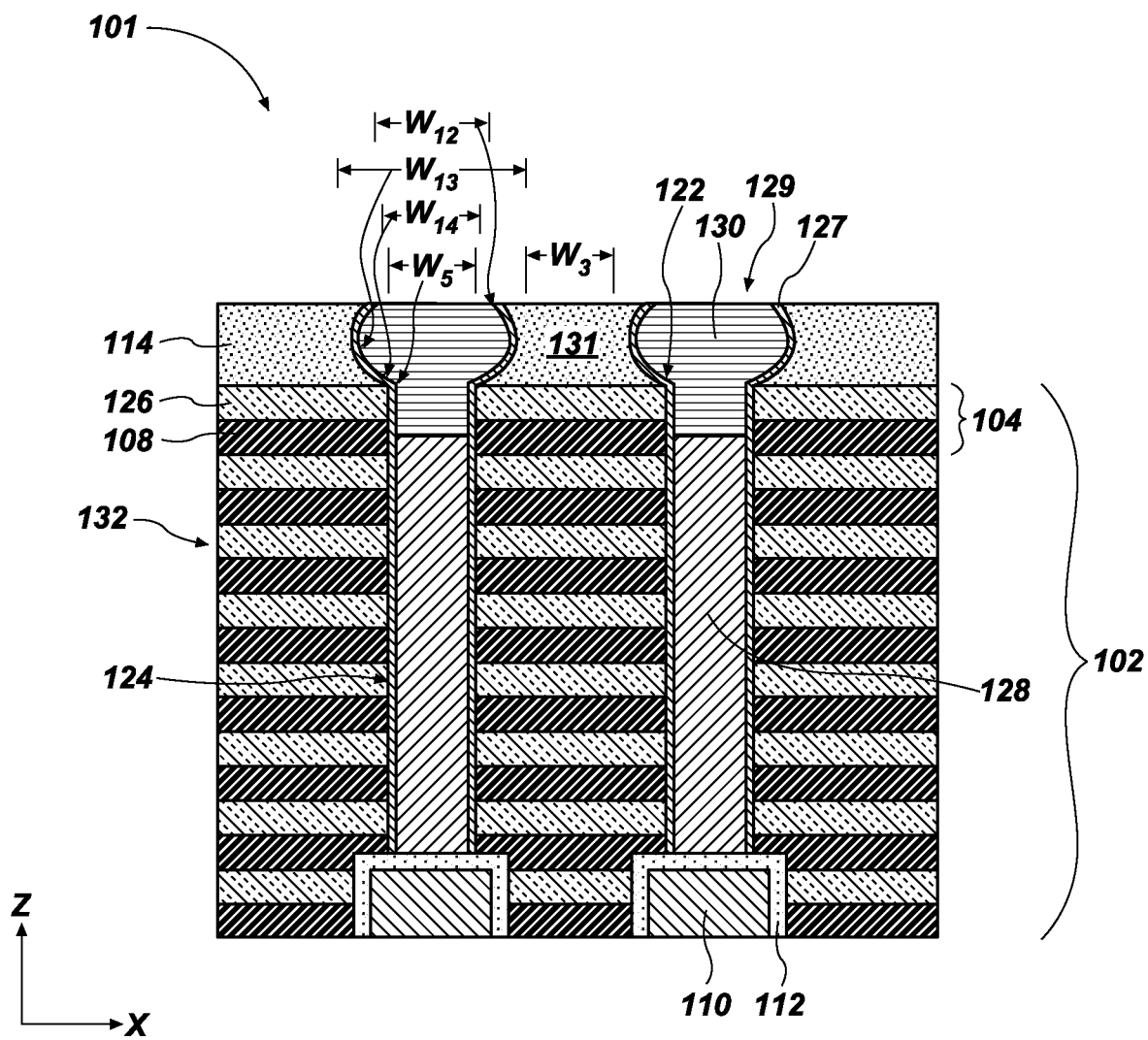

Referring to FIG. 4D, a microelectronic device structure 101 is depicted having plugs 130 with non-linear, bowed sidewalls. The non-linear, bowed sidewalls of the plugs 130 correspond to non-linear, bowed sidewalls of the cap dielectric material 114 formed according to a selective removal of second portions 119 in the formation of another embodiment of microelectronic device structure 101. The non-linear, bowed sidewalls result in an upper width $W_{12}$ that is less than a middle width $W_{13}$, where the middle width $W_{13}$ is greater than a lower width $W_{14}$, where each of the respective dimensions continuously transition (e.g., curves) to another of the respective dimensions.

An upper surface of the portion 131 of the cap dielectric material 114 may range from about 20 to about 40 nanometers between horizontal boundaries; whereas, a mid-section of the portion 131 may range from about 15 to about 30 nanometers in horizontal width, while a lower surface of the portion 131 may range from about 20 to about 40 nanometers. In other words, a horizontal dimension of the upper surface of portion 131 is greater than a horizontal dimension of the mid-section of the portion 131. Similarly, a horizontal dimension of the lower surface of the portion 131 of the cap dielectric material 114 is greater than a horizontal dimension of the mid-section of the portion 131.

Accordingly, disclosed is a microelectronic device comprising tiers of alternating dielectric materials and conductive materials. Pillars extend vertically through the tiers, and a cap oxide material is vertically adjacent to the tiers. The cap oxide material is formulated to exhibit a different etch rate relative to an etch rate of the dielectric materials of the tiers.

Accordingly, disclosed is a microelectronic device comprising tiers of alternating dielectric materials and conductive materials, with pillars extending vertically through the tiers. A cap oxide material is over the tiers. Sidewalls of the cap oxide material are offset from the sidewalls of the tiers.

By forming the pillar openings 120 having different widths in upper portions and lower portions, the materials of the pillars and the plugs 130 subsequently formed in the pillar openings 120 may have different widths in the upper portions relative to the lower portions. The width of the plugs 130 in the upper portions (e.g., laterally adjacent to the cap dielectric material 114) may be greater than the width of the pillars in the lower portions (e.g., laterally adjacent to the tiers 104). The plugs 130 may also exhibit multiple widths. A width of an upper portion of the plugs 130 may be greater than a width of a lower portion of the plugs 130. Therefore, the materials of the pillars and the plugs 130 may be formed in the pillar openings 120 without forming voids in (e.g., pinching off of) the pillars or the plugs 130. Additionally, the conductive material of the plugs 130 exhibits a larger surface area than in electronic devices formed by conventional process, increasing the process margin for coupling (e.g., electrically coupling) additional conductive components (e.g., conductive elements) of the second deck to the plugs 130. The increased surface area also facilitates improved landing between conductive structures of the first deck and conductive structures of the second decks. Therefore, the electronic device is formed without affecting electrical performance or downstream process acts.

In addition, substantial vertical alignment between the pillars of a first deck and pillars of a second deck is increased. Channel materials, cell materials, and conductive elements of the second deck that are subsequently formed over the first deck may have an increased process margin for coupling with the channel material and the cell materials of the first deck. The channel materials of the second deck may extend substantially continuously between the first and second decks. Therefore, misalignment between the decks is substantially reduced compared to conventional electronic devices. In such conventional electronic devices, misalignment occurs between conductive components of the decks, leading to electrical shorts. Therefore, microelectronic devices including the microelectronic device structures 101 of FIGS. 4A-4D may be formed without affecting electrical performance or downstream process acts.

Figure 5:
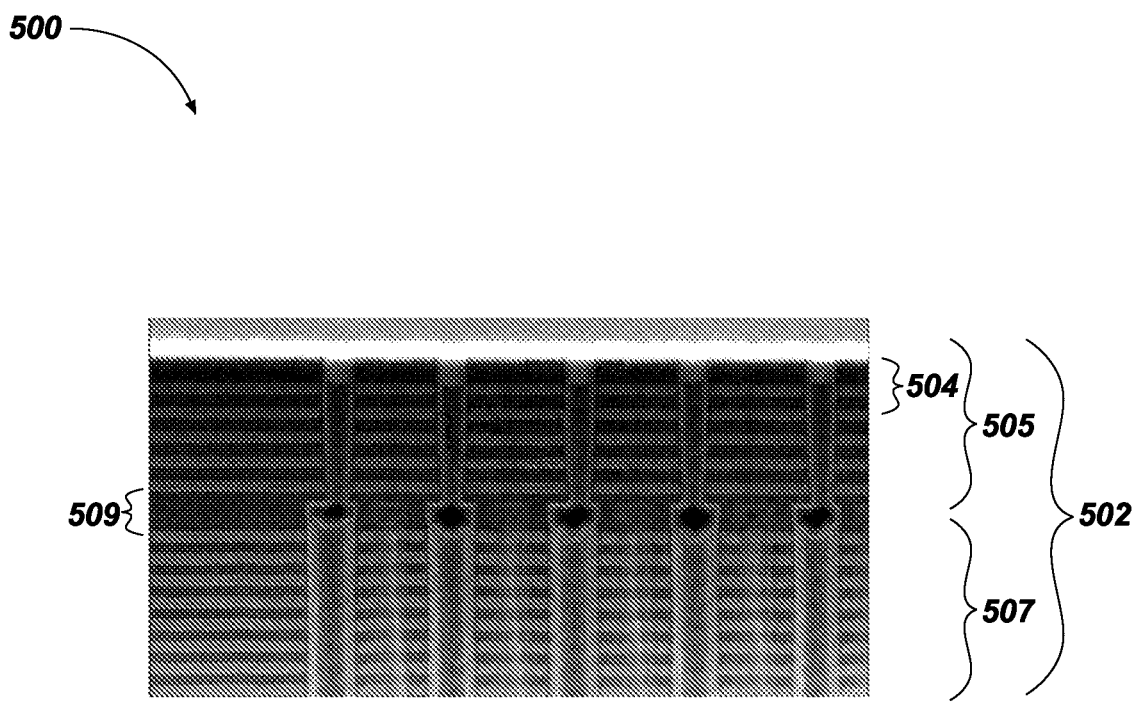
FIG. 5 is a partial cross-sectional view of a microelectronic device structure as used in a microelectronic system, in accordance with embodiments of the disclosure.

Referring to FIG. 5, a portion of a microelectronic system includes microelectronic device structure 500, having multiple decks 502, each with respective tiers 504 of alternating dielectric and conductive materials similar to microelectronic device structure 101. The multiple decks 502 may include an upper deck 505, a lower deck 507, and an interdeck dielectric 509 between the lower deck 507 and the upper deck 505. Each deck of the multiple decks 502 may be formed according to the previously described methods. The pillars of the upper deck 505 are aligned and electrically connected, according to the previously described methods, with the landing surfaces (e.g., plugs) of the lower deck 507. In some embodiments, the upper deck 505 comprises an uppermost deck of a microelectronic device structure.

Figure 6:
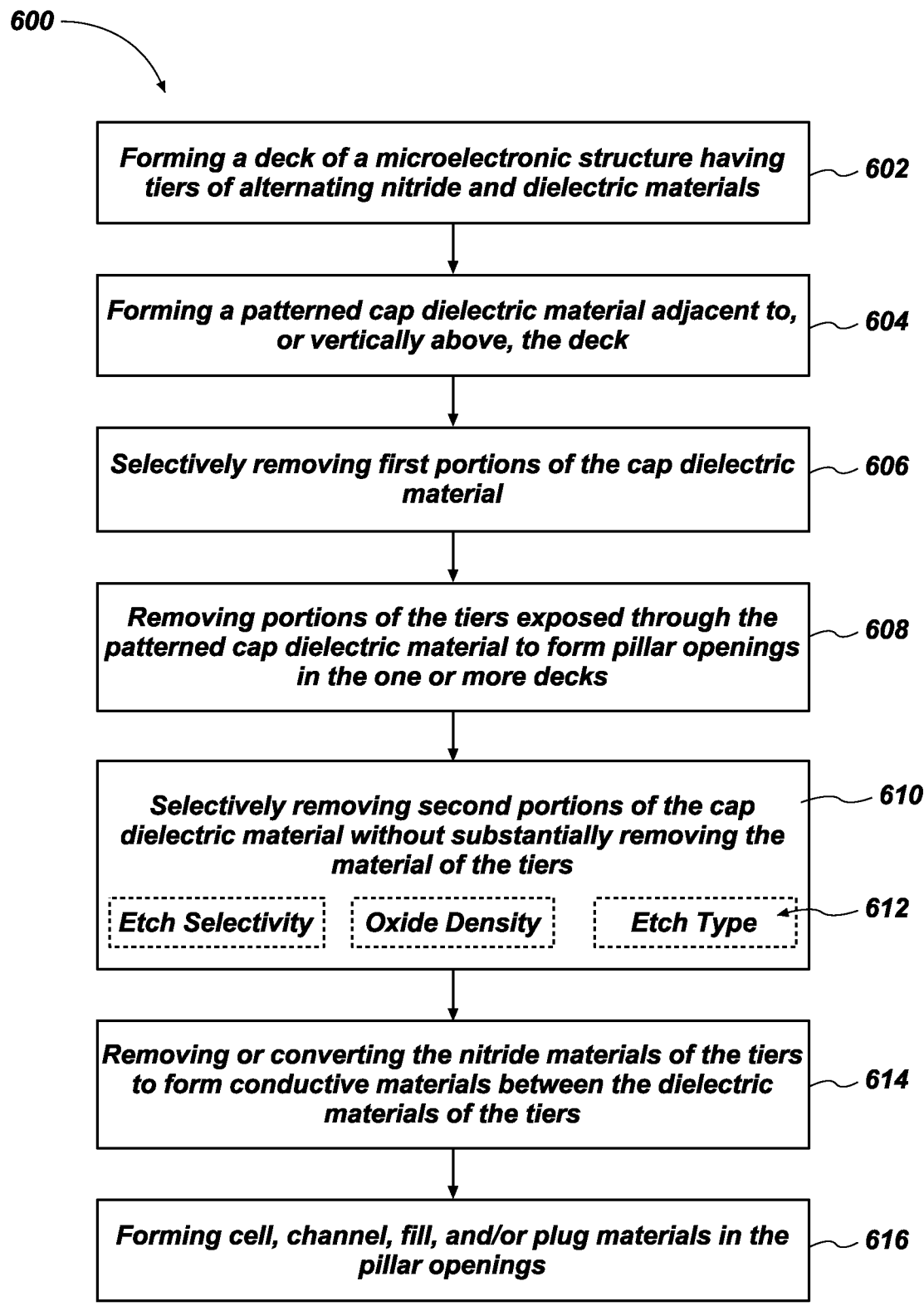
FIG. 6 is a flow diagram of a method of forming a microelectronic device structure, in accordance with embodiments of the disclosure.

Referring to FIG. 6, a method 600 of forming the microelectronic device structure 101 includes an act 602 of forming a deck of a microelectronic device structure (e.g., microelectronic device structure 100), having tiers of alternating nitride and dielectric materials.

The act 604 includes forming a patterned cap dielectric material adjacent to, or vertically above, an uppermost tier of the deck. The patterned cap dielectric material is used to form the underlying structures, such as pillar openings, in the cap dielectric material.

The act 606 includes selectively removing first portions of the cap dielectric material, without removing the materials of the tiers. In some embodiments, the selective removal of first portions of the cap dielectric material may occur as a result of forming the underlying structures (e.g., pillar openings) in the cap dielectric material due to differences in etch selectivity between the cap dielectric material and the alternating materials of the tiers. Only the first portions of cap dielectric material are removed when forming the underlying structures.

Upon removal of the first portions of cap dielectric material, in some embodiments, the act 608 includes removing portions of the tiers exposed through the patterned cap dielectric material to form pillar openings in the one or more decks of alternating materials. This removal act 608 occurs prior to metallization. In other embodiments, the material removal of act 608 occurs during act 606.

The act 610 includes the selective removal of second portions of the cap dielectric material, without substantially removing the materials of the tiers. In some embodiments, the first portions of the cap dielectric are removed simultaneous with the removal of the materials of the tiers, and the second portions of the cap dielectric material are removed without affecting the material of the tiers. In other embodiments, the first portions of the cap dielectric are removed without removing the materials of the tiers, such that a removal of the materials of the tiers precedes the selective removal of the second portions of the cap dielectric material. In additional embodiments, both first and second portions of the cap dielectric material are removed when forming the underlying structures due to the etch selectivity of the cap dielectric material relative to the dielectric material of the tiers, such that a final CD of the pillar openings may be obtained using a single material removal process (e.g., with etch chemistries varied in situ relative to the different materials to be removed). In these embodiments, the act 608 is optional.

The selective removal of the second portions of the cap dielectric material may depend on one or more formation parameters 612 previously obtained, adjusted, or controlled during the formation of either the cap dielectric material or the dielectric material of the tiers of alternating materials. For example, the formation parameters 612 may include, but is not limited to, an etch selectivity (e.g., of the cap dielectric vs. the dielectric of the tiers), an oxide density, an etch type (e.g., wet, dry, vapor, CMP, etc.) used to form the structures underlying the patterned hard mask material, etch chemistry, material formation precursors, chemical bond formation (e.g., resulting different material densities), and combinations thereof.

Act 614 occurs after formation of a slit structure through the tiers, and includes removing (e.g., exhuming) the nitride materials of the tiers of alternating materials. The voids created by their removal may be filled with conductive materials, forming alternating conductive and dielectric materials within the tiers of the deck of the microelectronic device structure (e.g., microelectronic device structure 101).

The act 616 of forming cell, channel, fill and/or plug materials in the pillar openings facilitates the formation of pillars and plugs of the microelectronic device structure. The pillars and plugs facilitate the electrical connection of a first deck (e.g., lower deck) with another deck (e.g., upper deck), or the electrical connection of a deck with another microelectronic device structure (e.g., CMOS).

Accordingly, disclosed is a method of forming a microelectronic device that includes forming tiers of alternating nitride materials and dielectric materials, and forming a cap dielectric material adjacent to the tiers. A first portion of the cap dielectric material is removed to form a patterned cap dielectric material. Portions of the tiers exposed through the patterned cap dielectric material are removed to form pillar openings in the tiers, and a second portion of the cap dielectric material is removed without substantially removing the nitride materials and the dielectric materials of the tiers. A channel material and cell film materials is formed in the pillar openings, and the nitride materials of the tiers are removed to form spaces between the dielectric materials of the tiers. A conductive material is formed in the spaces.

Figure 7:
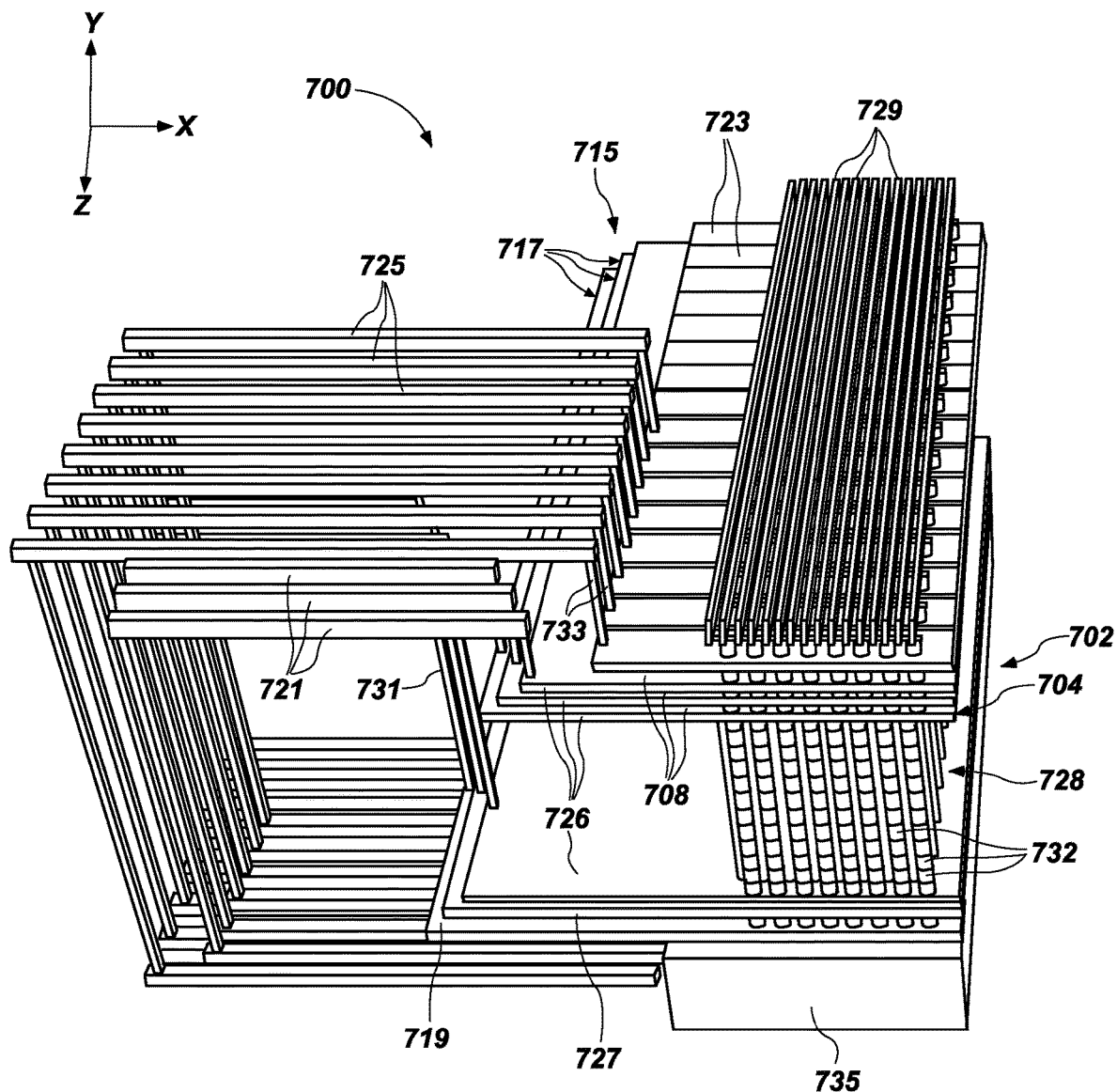
FIG. 7 is a simplified partial cutaway perspective view of a microelectronic device, in accordance with embodiments of the disclosure.

Referring to FIG. 7, microelectronic device structures 101 of the disclosure may be included in microelectronic devices (e.g., memory devices) of the disclosure. For example, FIG.

7 illustrates a partial cutaway perspective view of a portion of a microelectronic device 700 (e.g., a memory device, such as a 3D NAND Flash memory device) including a microelectronic device structure substantially similar to the microelectronic device structure 101 at or following the processing stage previously described with reference to FIGS. 4A to 4D. For clarity and ease of understanding the drawings and associated description, some features (e.g., structures, materials) of the microelectronic device structure 101 previously described herein are not shown in FIG. 7. However, it will be understood that any features of the microelectronic device structure 101 at or preceding a processing stage previously described with reference to FIGS. 4A to 4D, and that have been described herein with reference to one or more of FIGS. 1 through 4D, may be included in a microelectronic device structure of the microelectronic device 700 described herein with reference to FIG. 7.

As shown in FIG. 7, the microelectronic device 700 may include a deck structure 702 including a vertically alternating (e.g., in the Z-direction) sequence of conductive structures 726 and insulative structures 708 arranged in tiers 704 each including at least one of the conductive structures 726 vertically adjacent at least one of the insulative structures 708. The deck structure 702, the conductive structures 726, the insulative structures 708, and the tiers 704 may respectively correspond to the deck 102, the conductive structures (e.g., conductive materials 126), the insulative structures (e.g., dielectric materials 108), and the tiers 104 previously described with reference to FIGS. 4A to 4D. In addition, the microelectronic device includes cell pillar structures 732 corresponding to the structures of the cell pillars 129 previously described with reference to FIGS. 4A to 4D, vertically extending through the deck structure 702. Intersections of the cell pillar structures 732 and the conductive structures 726 of the deck structure 702 form strings of memory cells 728 vertically extending through the deck structure 702. The conductive structures 726 may serve as local access line structures (e.g., local word line structures) for the strings of memory cells 728. Furthermore, the microelectronic device 700 may also include one or more staircase structures 715 having steps 717 defined by edges (e.g., horizontal ends in the X direction) of the tiers 704 of the deck structure 702. The steps 717 of the staircase structures 715 may serve as contact regions for the conductive structures 726 of the deck structure 702.

The microelectronic device 700 may further include at least one source structure 719, access line routing structures 721, first select gates 723 (e.g., upper select gates, drain select gates (SGDs)), select line routing structures 725, one or more second select gates 727 (e.g., lower select gates, source select gate (SGSs)), digit line structures 729, access line contact structures 731, and select line contact structures 733. The digit line structures 729 may be coupled to the cell pillar structures 732 by way of additional contact structures, plug structures, and pillar contact structures. For example, the digit line structures 729 may vertically overlie and physically contact the additional contact structures; the additional contact structures may vertically overlie and physically contact the plug structures; the plug structures may vertically overlie and physically contact the pillar contact structures; and the pillar contact structures may physically contact the cell pillar structures 732 (e.g., corresponding to the cell pillars 129 (FIGS. 4A to 4D)). In addition, the access line contact structures 731 and the select line contact structures 733 may couple additional features of the microelectronic device 700 to one another as shown (e.g., the select line routing structures 725 to the first select gates 723, the access line routing structures 721 to the conductive structures 726 of the tiers 704 of the deck structure 702).

The microelectronic device 700 may also include a base structure 735 positioned vertically below the cell pillar structures 732 (and, hence, the strings of memory cells 728). The base structure 735 may include at least one control logic region including control logic devices configured to control various operations of other features (e.g., the strings of memory cells 728) of the microelectronic device 700. As a non-limiting example, the control logic region of the base structure 735 may further include one or more (e.g., each) of charge pumps (e.g., VCCP charge pumps, VNEGWL charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 735 may be coupled to the source structure 719, the access line routing structures 721, the select line routing structures 725, and the digit line structures 729. In some embodiments, the control logic region of the base structure 735 includes CMOS (complementary metal-oxide-semiconductor) circuitry. In such embodiments, the control logic region of the base structure 735 may be characterized as having a "CMOS under Array" ("CuA") configuration. Although a CuA configuration is depicted, in other embodiments, the base structure 735 may be located above the digit line structures 729 and configured as a "CMOS over Array" ("CoA") device.

Microelectronic device structures (e.g., the microelectronic device structure 101 at or following the processing stage previously described with reference to FIGS. 4A to 4D) and microelectronic devices (e.g., the microelectronic device 700 (FIG. 7)) in accordance with embodiments of the disclosure may be used in embodiments of electronic systems of the disclosure.

The microelectronic device 700 according to embodiments of the disclosure may include, but is not limited to, a 3D electronic device, such as a 3D NAND Flash memory device, such as a multideck 3D NAND Flash memory device. The microelectronic device 700 formed according to embodiments of the disclosure may be used in any 3D microelectronic device where reduced or eliminated pillar misalignment is desired.

Figure 8:
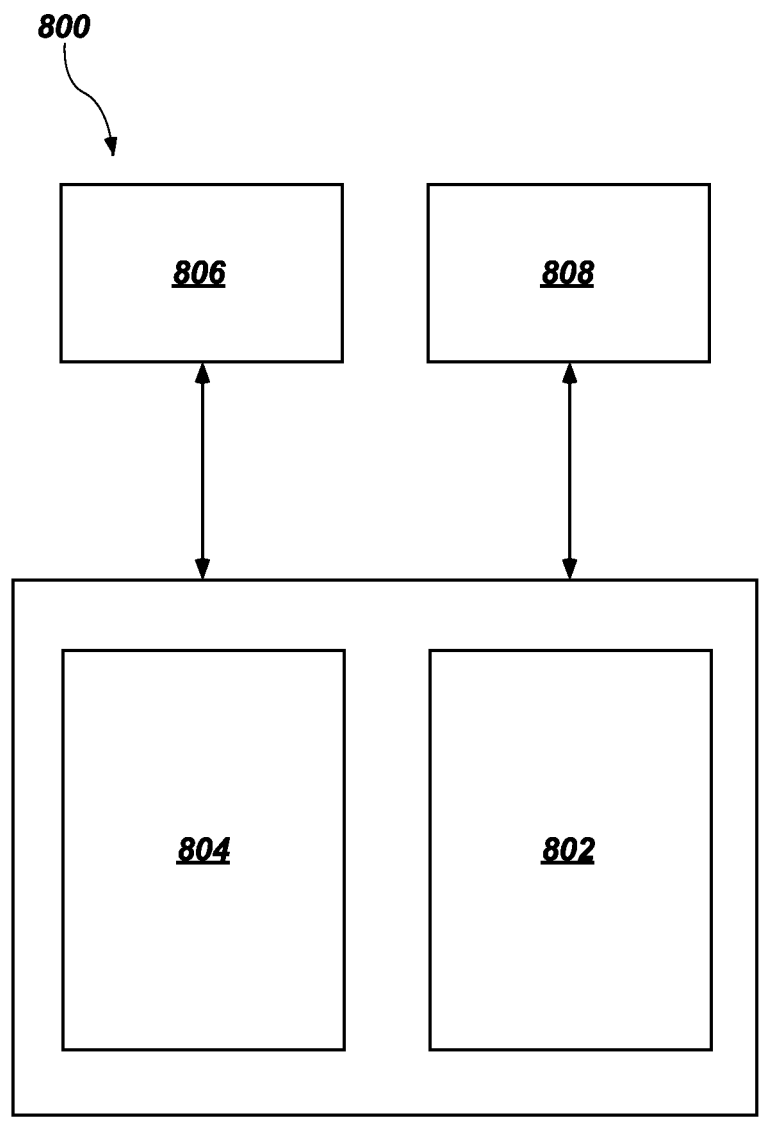
FIG. 8 is a schematic block diagram illustrating a microelectronic system, in accordance with embodiments of the disclosure.

For example, FIG. 8 is a block diagram of a microelectronic system 800 implemented according to one or more embodiments described herein. The microelectronic system 800 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The microelectronic system 800 includes at least one memory device 802, which includes one or more microelectronic device structures 101 as previously described. The microelectronic system 800 may further include at least one processor 804, such as a microprocessor, to control the processing of system functions and requests in the microelectronic system 800. The processor 804 and other subcomponents of the microelectronic system 800 may include the memory cells. The processor 804 may, optionally, include one or more microelectronic device structures 101 as previously described relative to FIGS. 4A to 4D.

Various other devices may be coupled to the processor 804 depending on the functions that the microelectronic system 800 performs. For example, an input device 806 may be coupled to the processor 804 for inputting information into the microelectronic system 800 by a user, such as, for example, a mouse or other pointing device, a button, a switch, a keyboard, a touchpad, a light pen, a digitizer and stylus, a touch screen, a voice recognition system, a microphone, a control panel, or a combination thereof. An output device 808 for outputting information (e.g., visual or audio output) to a user may also be coupled to the processor 804. The output device 808 may include an LCD display, an SED display, a CRT display, a DLP display, a plasma display, an OLED display, an LED display, a three-dimensional projection, an audio display, or a combination thereof. The output device 808 may also include a printer, an audio output jack, a speaker, etc. In some embodiments, the input device 806 and the output device 808 may comprise a single touchscreen device that can be used both to input information to the microelectronic system 800 and to output visual information to a user. The one or more input devices 806 and output devices 808 may communicate electrically with at least one of the memory devices 802 and the processor 804. The at least one memory device 802 and processor 804 may also be used in a system on chip (SoC).

Accordingly, disclosed is a microelectronic system comprising an input device, an output device, a processor device operably coupled to the input device and the output device, and a memory device operably coupled to the processor device. The memory device may be made up of one or more decks including tiers of alternating oxide materials and conductive materials. The memory device may further include pillars extending vertically through the one or more decks and a cap material over the one or more decks. The cap material may include a different oxide material than the oxide materials of the tiers. The memory device may further include a plug laterally adjacent to the cap material and overlying the pillars, where the plug exhibits two or more different widths along a height thereof.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   tiers of alternating dielectric materials and conductive materials;
   pillars extending vertically through the tiers; and
   a cap oxide material vertically adjacent to the tiers, the cap oxide material formulated to exhibit a different etch rate relative to an etch rate of the dielectric materials of the tiers, first sidewalls of the pillars and second sidewalls of the cap oxide material defining a step change between the cap oxide material and the tiers.

2. The microelectronic device of claim 1, wherein the cap oxide material directly contacts an uppermost tier of the tiers of alternating dielectric materials and conductive materials.

3. The microelectronic device of claim 2, wherein the dielectric materials of the tiers comprise a first silicon oxide material and the cap oxide material comprises a second silicon oxide material, the second silicon oxide material exhibiting a different quality than the first silicon oxide material.

4. The microelectronic device of claim 3, wherein the different quality comprises a different density.

5. The microelectronic device of claim 1, further comprising: conductive plugs adjacent to the pillars.

6. The microelectronic device of claim 5, wherein a width of at least one of the conductive plugs is increased relative to a width of the pillars.

7. The microelectronic device of claim 1, wherein the first sidewalls and the second sidewalls defining the step change are tapered, linearly bowed, or curved.

8. A microelectronic device, comprising:
   tiers of alternating dielectric materials and conductive materials;
   pillars extending vertically through the tiers;
   a cap oxide material over the tiers, sidewalls of the cap oxide material offset from sidewalls of the tiers; and
   a conductive plug laterally adjacent to the ca oxide material and the tiers a width of the conductive plug laterally adjacent to the tiers less than a width of the conductive plug laterally adjacent to the cap oxide material.

9. The microelectronic device of claim 8, wherein the conductive plug has substantially vertical sidewalls.

10. The microelectronic device of claim 8, wherein the conductive plug has curved sidewalls.

11. A microelectronic system, comprising:
    an input device;
    an output device;
    a processor device operably coupled to the input device and the output device; and
    a memory device operably coupled to the processor device, the memory device comprising:
      one or more decks comprising tiers of alternating oxide materials and conductive materials;
      pillars extending vertically through the one or more decks;
      a cap material over the one or more decks, the cap material comprising a different oxide material than the oxide materials of the tiers; and
      a plug laterally adjacent to the cap material and overlying the pillars, the plug exhibiting two or more different widths along a height thereof.

12. The microelectronic system of claim 11, wherein the plug extends through the cap material and into the tiers.

13. The microelectronic system of claim 12, wherein a width of the plug laterally adjacent to the tiers is less than a width of the plug laterally adjacent to the cap material.

14. The microelectronic system of claim 11, wherein the memory device comprises a three-dimensional NAND memory device.

15. A method of forming a microelectronic device, comprising:
    forming tiers of alternating nitride materials and dielectric materials;

forming a cap oxide material vertically adjacent to the tiers, the cap oxide material formulated to exhibit a different etch rate relative to an etch rate of the dielectric materials of the tiers;

removing a first portion of the cap oxide material to form a patterned cap dielectric material;

removing portions of the tiers exposed through the patterned cap oxide material to form pillar openings in the tiers;

removing a second portion of the cap oxide material without substantially removing the nitride materials and the dielectric materials of the tiers;

forming a channel material and cell film materials in the pillar openings to form pillars extending vertically through the tiers first sidewalls of the pillars and second sidewalls of the ca oxide material defining a step change between the cap oxide material and the tiers;

removing the nitride materials of the tiers to form spaces between the dielectric materials of the tiers; and forming a conductive material in the spaces to form tiers of alternating dielectric materials and conductive materials.

16. The method of claim 15, wherein removing a second portion of the cap oxide material without substantially removing the nitride materials and the dielectric materials of the tiers comprises selectively removing portions of a cap oxide material adjacent the tiers.

17. The method of claim 15, wherein forming tiers of alternating nitride materials and dielectric materials comprises using a first atomic layer deposition (ALD) process to deposit the tiers, and wherein forming a cap oxide material adjacent to the tiers comprises using a second, different ALD process to deposit an oxide material adjacent the tiers.

18. The method of claim 15, wherein forming tiers of alternating nitride and dielectric materials comprises using an ALD process to deposit the tiers, and wherein forming a cap oxide material adjacent to the tiers comprises using a chemical vapor deposition (CVD) process to deposit an oxide material adjacent the tiers.

19. The method of claim 15, wherein forming a cap oxide material adjacent to the tiers comprises forming an oxide material having a different oxide density than an oxide material of the dielectric materials of the tiers.

20. The method of claim 15, wherein forming a cap oxide material adjacent to the tiers comprises forming the cap oxide material to be selectively etchable relative to the dielectric materials of the tiers.

* * * * *